(12) United States Patent
Hahm et al.

(10) Patent No.: US 9,434,093 B2
(45) Date of Patent: Sep. 6, 2016

(54) METHOD OF MANUFACTURING MASTER MOLD

(71) Applicant: Samsung Electronics Co., Ltd., Suwon-si, Gyeonggi-do (KR)

(72) Inventors: Sukgyu Hahm, Gyeongju-si (KR); Dongouk Kim, Pyeongtaek-si (KR); Joonyong Park, Suwon-si (KR); Jihyun Bae, Seoul (KR); Bongsu Shin, Seoul (KR); Sunghoon Lee, Seoul (KR); Hongseok Lee, Seongnam-si (KR); Jaeseung Chung, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/557,712

(22) Filed: Dec. 2, 2014

(65) Prior Publication Data
US 2015/0314488 A1 Nov. 5, 2015

(30) Foreign Application Priority Data

May 2, 2014 (KR) .................. 10-2014-0053623

(51) Int. Cl.
| | |
|---|---|
| *B29C 33/38* | (2006.01) |
| *G03F 7/00* | (2006.01) |
| *B29K 101/10* | (2006.01) |
| *B29L 31/00* | (2006.01) |
| *B29C 33/42* | (2006.01) |

(52) U.S. Cl.
CPC .............. *B29C 33/3878* (2013.01); *G03F 7/00* (2013.01); *B29C 33/424* (2013.01); *B29C 2033/426* (2013.01); *B29K 2101/10* (2013.01); *B29L 2031/757* (2013.01)

(58) Field of Classification Search
CPC .............. A61K 9/0097; A61K 9/5138; A61K 9/5153; A61K 9/5192; B81C 99/0085; G03F 7/0002; G03F 1/00; B82Y 10/00
See application file for complete search history.

(56) References Cited

U.S. PATENT DOCUMENTS

| | | | |
|---|---|---|---|
| 2008/0131791 A1* | 6/2008 | Cho et al. ................... | 430/5 |
| 2009/0001634 A1* | 1/2009 | Hiroshima ................ | 264/447 |
| 2009/0262362 A1 | 10/2009 | de Groot et al. | |
| 2010/0013354 A1 | 1/2010 | Marth et al. | |

(Continued)

FOREIGN PATENT DOCUMENTS

| | | |
|---|---|---|
| JP | 2010069730 A | 4/2010 |
| KR | 1020120082266 A | 7/2012 |

(Continued)

OTHER PUBLICATIONS

Translation of KR-1020120083808A.*

*Primary Examiner* — Duy Deo
(74) *Attorney, Agent, or Firm* — Cantor Colburn LLP

(57) ABSTRACT

A method of manufacturing a master mold includes forming a plurality of replica resin layers using a mold; forming a replica template by bonding the plurality of replica resin layers on a template; forming a replica mold layer having a pattern corresponding to a pattern of the plurality of replica resin layers using the replica template; forming a flexible stamp having a pattern formed on a surface thereof using the replica mold layer; transferring the pattern formed on the surface of the flexible stamp to a mold resin; and forming a large area master mold by etching a surface of a substrate based on a pattern shape of the mold resin.

13 Claims, 11 Drawing Sheets

(56) References Cited

U.S. PATENT DOCUMENTS

2012/0176663 A1* 7/2012 Zang et al. .................. 359/296
2013/0153534 A1 6/2013 Resnick et al.

FOREIGN PATENT DOCUMENTS

KR 101200562 B1 11/2012
KR 101269917 B1 5/2013

* cited by examiner

METHOD OF MANUFACTURING MASTER MOLD

RELATED APPLICATIONS

This application claims priority to Korean Patent Application No. 10-2014-0053623, filed on May 2, 2014, and all the benefits accruing therefrom under 35 U.S.C. §119, the content of which in its entirety is herein incorporated by reference.

BACKGROUND

1. Field

The disclosure relates to a method of manufacturing a master mold.

2. Description of the Related Art

A pattern transferring technique has been developed in various ways. The pattern transferring technique is used in various fields such as fine processing fields of semiconductor circuits, hard disk drivers ("HDD" s), molecular memories, wire grid polarizers, displays or bio sensors, and recently the necessity for fine pattern transferring techniques in such a field has increased. Nano-imprint lithography ("NIL") has drawn attention as an effective and economical pattern forming technique. Nano-imprint has been proposed to realize an ultra-fine processing and is referred to as a technique for directly transferring a nano pattern on a substrate.

A master for nano-imprint is typically manufactured using a photolithography process. Such a photolithography process typically includes disposing a photoresist ("PR") on a material layer formed of various materials, exposing the PR at a periodic interval, and forming a pattern by developing the PR, such that a master for nano-imprint may be manufactured by performing an etching process using such a pattern. However, an area of a fine pattern that can be manufactured using the photolithography process may be limited, and in the case of fields that desire a fine pattern over a large area, the manufacture of a master may not be effectively preformed using the photolithography process.

SUMMARY

Provided are embodiments of a method of manufacturing a large area master mold.

Provided are embodiments of a method of manufacturing a replica template that uses a plurality of replica resin layers manufactured from a single mold or a plurality of replica resin layers that are respectively formed from a plurality of molds, and a method of manufacturing a master mold from the replica template.

According to an embodiment of the invention, a method of manufacturing a master mold includes: forming a plurality of replica resin layers using a mold; forming a replica template by bonding the plurality of replica resin layers on a template; forming a replica mold layer having a pattern corresponding to a pattern of the plurality of replica resin layers using the replica template; forming a flexible stamp having a pattern formed on a surface thereof using the replica mold layer; transferring the pattern formed on the surface of the flexible stamp to a mold resin; and forming the master mold having a large area by etching a surface of a substrate based on a pattern shape of the mold resin.

In an embodiment, the forming the replica template may include bonding the plurality of replica resin layers on the template after the forming the plurality of replica resin layers using the mold.

In an embodiment, the forming the plurality of replica resin layers may include using a plurality of molds.

In an embodiment, the method of manufacturing the master mold may further include providing an adhesive layer between the plurality of replica resin layers and the template.

In an embodiment, the plurality of replica resin layers may be aligned with each other and bonded on the template, and at least a portion of each of the plurality of replica resin layers may overlap another replica resin layer.

In an embodiment, the forming the flexible stamp may include using a capillary force lithography.

In an embodiment, the transferring the pattern formed on the surface of the flexible stamp to the mold resin may include disposing the flexible stamp on a flexible plate; and applying a pressure on the flexible plate toward the mold resin provided on the substrate.

According to another embodiment of the invention, a method of manufacturing a master mold includes: forming a plurality of replica resin layers using a mold; forming a replica template by bonding the plurality of replica resin layers on a template; forming a first photoresist layer having a pattern corresponding to a pattern of the plurality of replica resin layers; forming a second photoresist layer having a pattern corresponding to the pattern of the first photoresist layer on the first photoresist layer; disposing the second photoresist layer on a substrate; separating the second photoresist layer from the first photoresist layer; and forming the master mold having a large area by etching a surface of the substrate based on the pattern shape of the second photoresist layer.

In an embodiment, the method of manufacturing the master mold may further include: bonding a flexible plate on the first photoresist layer; and separating the first photoresist layer from the replica template after the first photoresist layer is formed on the replica template.

In an embodiment, the method of manufacturing the master mold may further include providing an adhesive layer between the first photoresist layer and the flexible plate.

In an embodiment, the first photoresist layer and the second photoresist layer may be formed of different materials from each other.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1A:
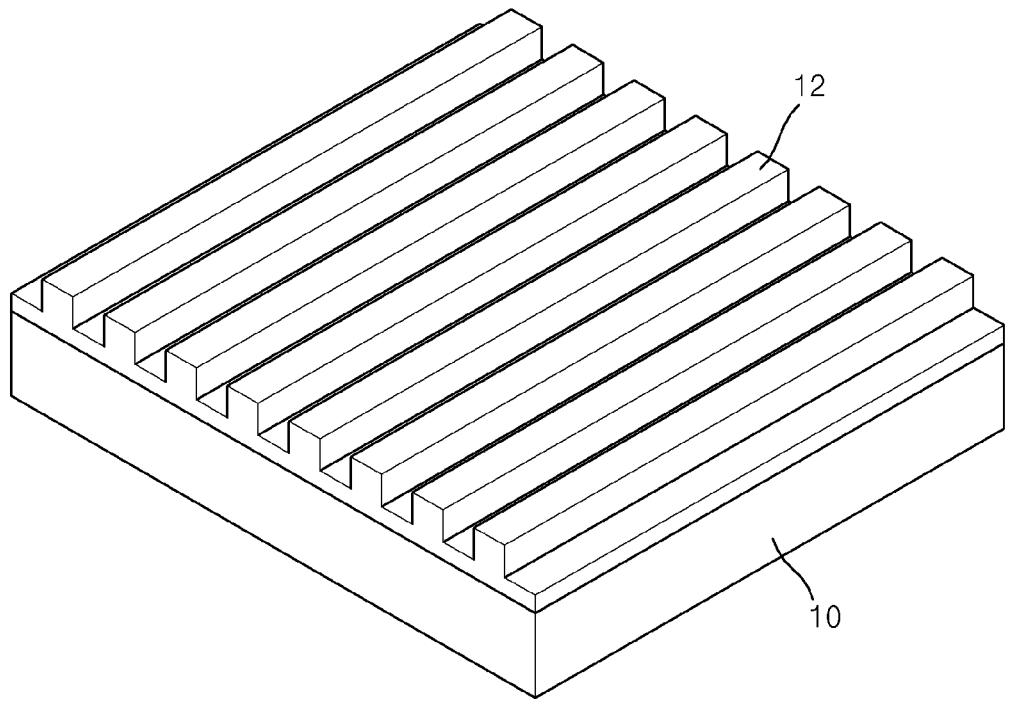
FIGS. 1A through 1C are perspective views showing an embodiment of a method of manufacturing a replica resin layer from a mold.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of a master mold according to the invention will be described in detail with reference to the accompanying drawings.

Figure 1B:
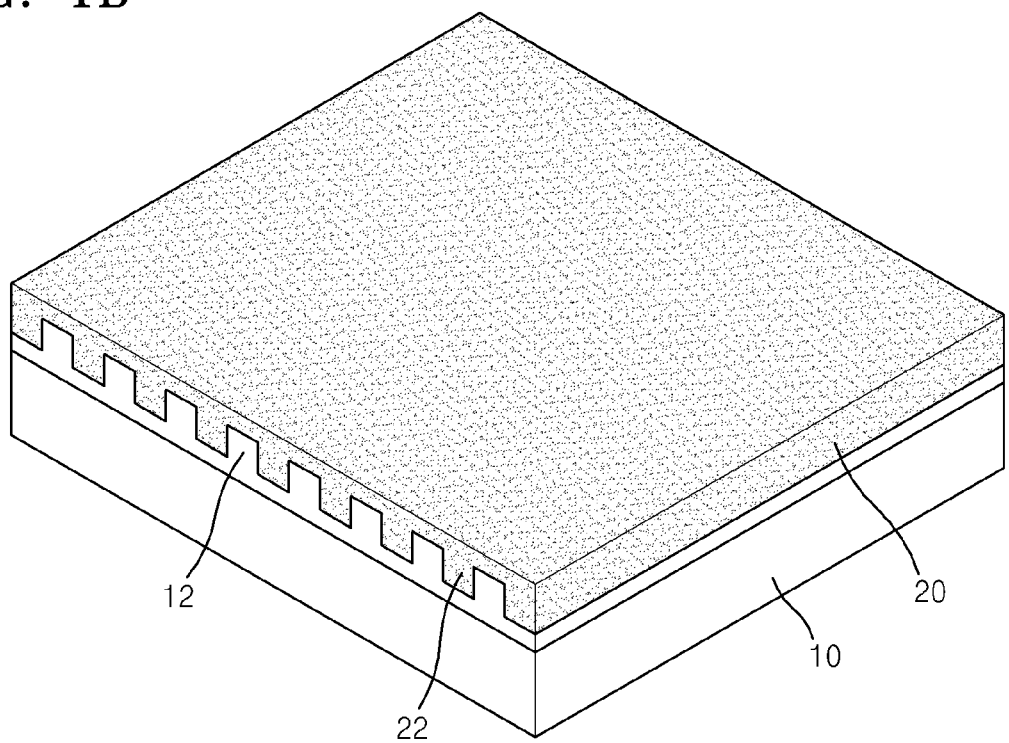
Figure 1C:
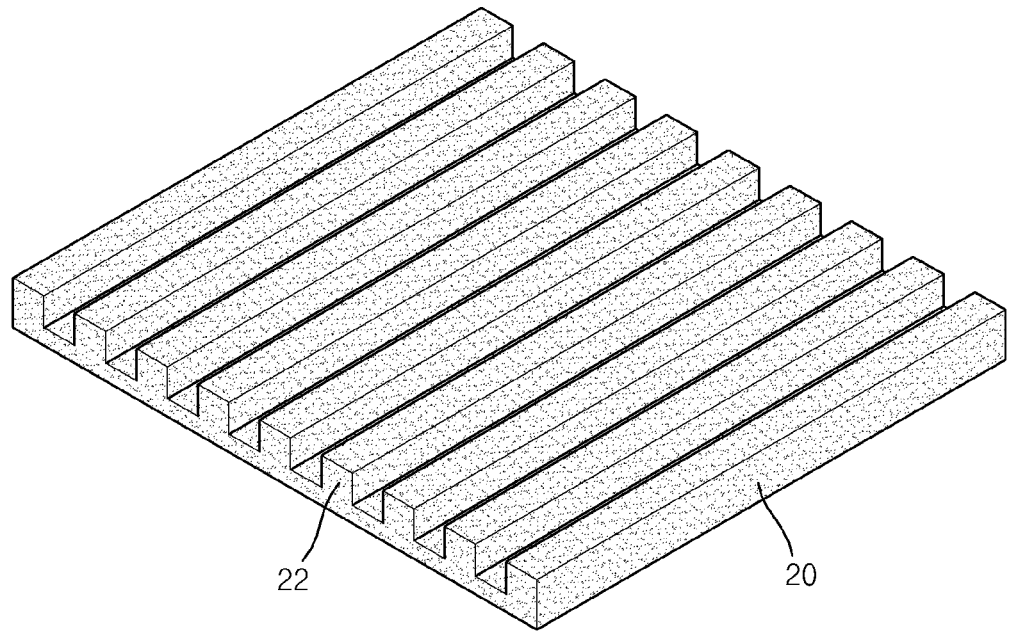

FIGS. 1A through 1C are perspective views showing an embodiment of a method of manufacturing a replica resin layer from a mold 10;

Referring to FIG. 1A, in an embodiment, the mold 10, on which a pattern 12 is defined or formed, is prepared. The mold 10 may be a nano-imprint master mold, and the pattern 12 may have a two- or three-dimensional structure having various shapes. The mold 10 may include or be formed of silicon, silicon oxide, silicon nitride, glass, or various semiconductor materials, for example. The pattern 12 may have a predetermined shape based on use thereof. In an embodiment, as shown in FIG. 1A, the mold 10 has a shape that perpendicularly protrudes to form the pattern 12. However, in the shape of the mold 10 is not limited thereto, and, in an alternative embodiment, the shape of the mold 10 may include a shape that extends substantially perpendicular to a bottom of the pattern 12, a slanted shape having an angle about 45 degrees, a round shape, or a combination thereof. In an embodiment, the pattern 12 may have different widths. The mold 10 may be formed by various ways, for example, after a mask, on which a pattern is formed by a photo process, is disposed on a silicon, silicon oxide, silicon nitride, glass, or various semiconductor materials, the mold 10 on which the pattern 12 is formed may be manufactured by performing an etching process.

Referring to FIG. 1B a replica resin layer 20 is formed by coating a resin on the mold 10. A pattern 22 corresponding to the pattern 12 on the mold 10 may be formed on the replica resin layer 20. In an embodiment, the resin may be, for example, a functionalized prepolymer that includes an acrylate group or epoxy. In an embodiment, the resin may further include a photoinitiator or a hardener to allow the resin to have reactivity with light, such as ultraviolet ("UV") rays, or a releasing agent to allow the resin to be readily separated from the mold 10. The resin may be coated on the mold 10 using various methods, for example, a spin coating method, a dip coating method, an ink-jet method, or a slit-nozzle method. After the resin is coated on the mold 10, a UV curing or a drying process may additionally be performed.

Referring to FIG. 1C, the replica resin layer 20 may be separated from the mold 10. The replica resin layer 20 may be separated from the mold 10 in various ways. In one embodiment, for example, a releasing agent may be included in the replica resin layer 20. In an alternative embodiment, a material layer having a physical, chemical, or electronic bonding force with the replica resin layer 20 greater than the bonding force between the mold 10 and the replica resin layer 20 may further be additionally provided or formed on an surface of the replica resin layer 20, which is opposite to a patterned surface thereof on which the pattern 22 is formed. In one embodiment, for example, the material layer may include a Si group adhesive or a UV-cross linking agent. In an alternative embodiment, the replica resin layer 20 may be separated from the mold 10 using a vacuum force or an electrostatic force.

Figure 2:
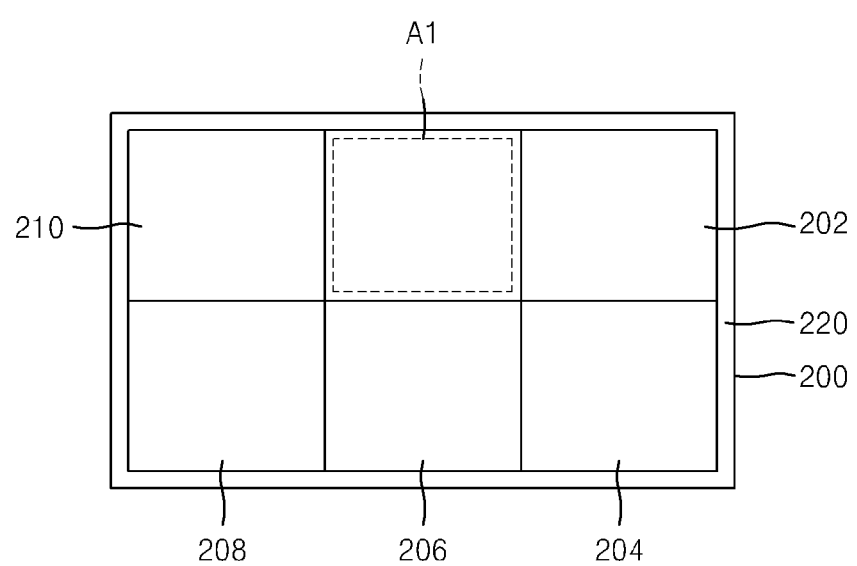
FIG. 2 is a plan view showing an embodiment of a method of manufacturing a large area replica template using the replica resin layer manufactured by the method of FIGS. 1A through 1C.

A large area replica template may be manufactured from a plurality of replica resin layers 20 that are formed using an embodiment of the method described with reference to FIGS. 1A through 1C. FIG. 2 shows a large area replica template manufactured by the replica resin layers 20 that are formed using an embodiment of the method described with reference to FIGS. 1A through 1C.

FIG. 2 is a plan view showing an embodiment of a method of manufacturing a large area replica template using the replica resin layers manufactured by the method of FIGS. 1A through 1C.

Referring to FIG. 2, a plurality of replica resin layers 202, 204, 206, 208 and 210, on each of which a pattern is formed as shown in FIG. 1C, are aligned on a template 200. In such an embodiment, to dispose the replica resin layers 202, 204, 206, 208 and 210 on the template 200, an adhesive layer 220 may further be formed between the template 200 and the replica resin layers 202, 204, 206, 208 and 210. In an embodiment, when the mold 10, on which the replica resin layer 20 is formed, is removed, the mold 10 may be separated from the replica resin layer 20 by bonding a surface of the replica resin layer 20, on which the pattern 22 is not formed, to the adhesive layer 220 on the template 200. In such an embodiment, the replica resin layers 202, 204, 206, 208 and 210 may be bonded to the template 200 to allow the patterns thereof to face outwards, e.g., upwards.

In an embodiment, an additional replica resin layer may be disposed on a region A1 of the template 200, and an alignment between the replica resin layers 202, 204, 206, 208 and 210 may be precisely controlled. For the alignment between the replica resin layers 202, 204, 206, 208 and 210, an aligning mask or a pattern may be formed on the replica resin layers 202, 204, 206, 208 and 210 or the template 200. In an embodiment, a piezo based sub-nano-scale positioning stage technique or an optical interference pattern align method may be used to transfer or align the replica resin layers 202, 204, 206, 208 and 210 after the replica resin layers 202, 204, 206, 208 and 210 are formed. In an embodiment, the replica resin layers 202, 204, 206, 208 and 210 may be spaced apart from each other such that an empty space may be defined therebetween. In an alternative embodiment, each of the replica resin layers 202, 204, 206, 208 and 210 may be aligned to partially overlap with another to remove such an empty space. The replica resin layers 202, 204, 206, 208 and 210 may be formed from a single mold 10, or may be respectively formed from a plurality of molds 10, on which different patterns are formed.

A large area replica template may be formed through an embodiment of the method described above by aligning and bonding the replica resin layers 202, 204, 206, 208 and 210 on the template 200, and a large area master mold may be manufactured using the large area replica template.

FIGS. 3A through 3G are perspective views showing an embodiment of a method of manufacturing a large area master mold using a large area replica template, according to the invention.

Figure 3A:
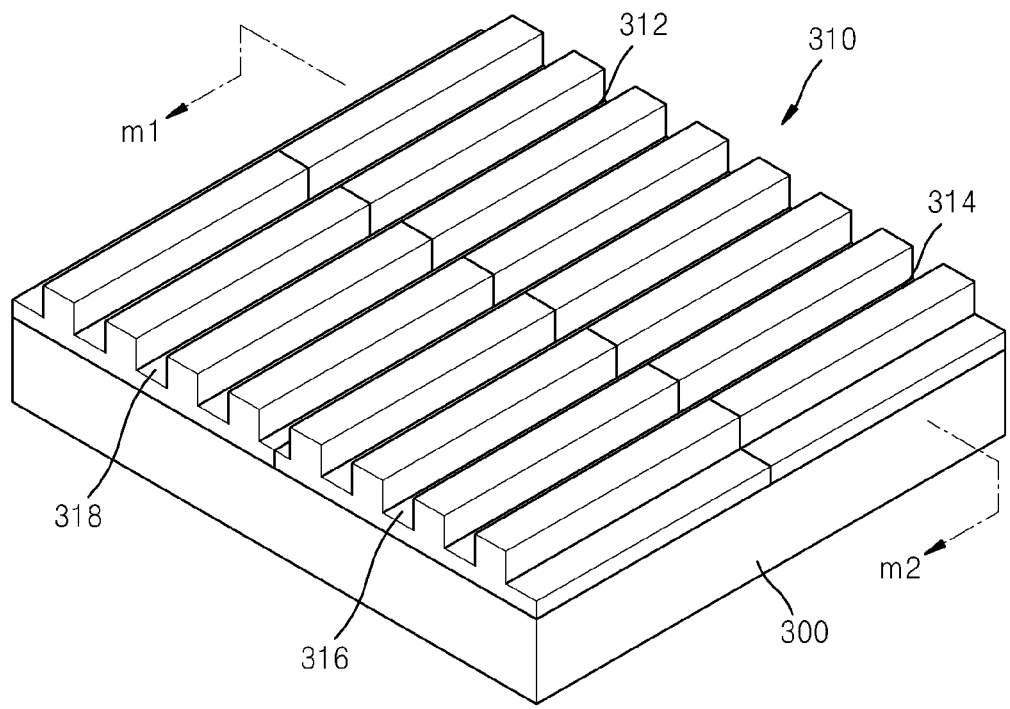
FIGS. 3A through 3G are perspective views showing an embodiment of a method of manufacturing a large area master mold using a large area replica template, according to the invention.

Referring to FIG. 3A, a replica template includes a resin layer 310 on a template 300. The resin layer 310 is formed by bonding a plurality of replica resin layers 312, 314, 316 and 318 to each other, and the number and size of the replica resin layers 312, 314, 316 and 318 that are included in the resin layer 310 may be variously modified based on use thereof. The template 300 may have a size corresponding to the number and size of the replica resin layers 312, 314, 316 and 318, and may include or be formed of silicon, silicon oxide, silicon nitride, glass, or various semiconductor materials.

Figure 3B:
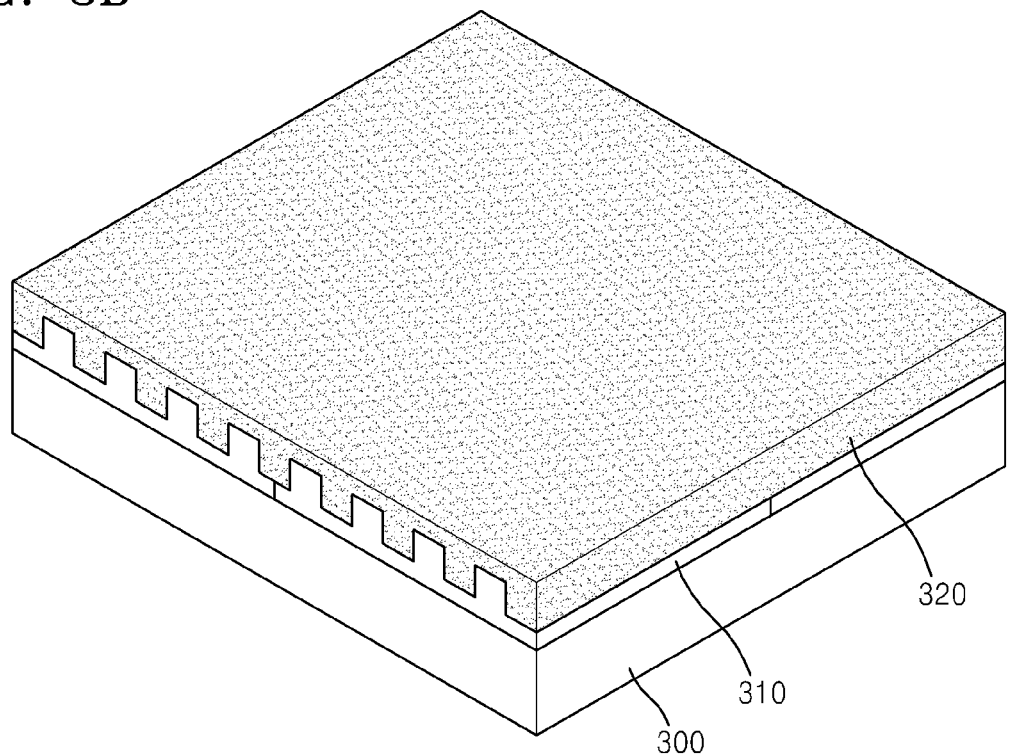
Figure 3C:
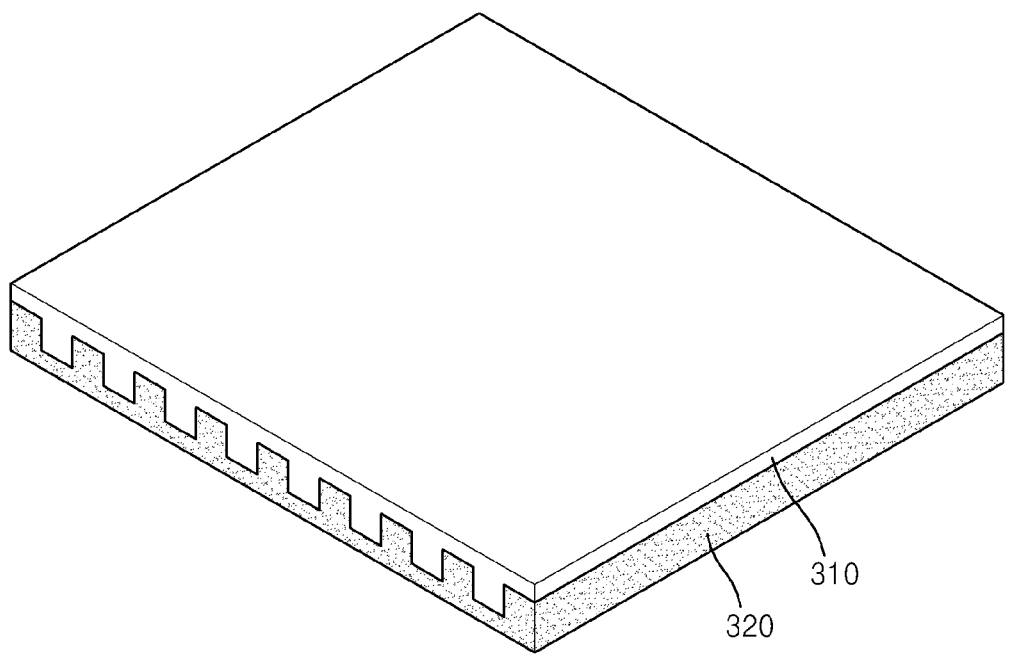

Referring to FIG. 3B, a replica mold layer 320 having a pattern corresponding to the pattern shape of the resin layer 310 may be formed on the resin layer 310. In an embodiment, the replica mold layer 320 may include or be formed of a metal material, a semiconductor material, or a dielectric material, for example, but not being limited thereto. In one embodiment, for example, the replica mold layer 320 may be formed by coating a metal, such as Ni, using an electroforming process. The replica mold layer 320 shown in FIG. 3B or 3C itself may be used as a master mold. However, in such an embodiment, where the resin layer 310 is formed by bonding the replica resin layers 312, 314, 316 and 318, a height difference between the replica resin layers 312, 314, 316 and 318 may occur. In an embodiment, where the replica resin layers 312, 314, 316 and 318 are bonded by a partial overlap to remove gaps or spaces between the replica resin layers 312, 314, 316 and 318, and thus, a height difference or a discontinuous region between patterns on a surface of the resin layer 310 may occur, which will be described with reference to FIG. 4.

Figure 4:
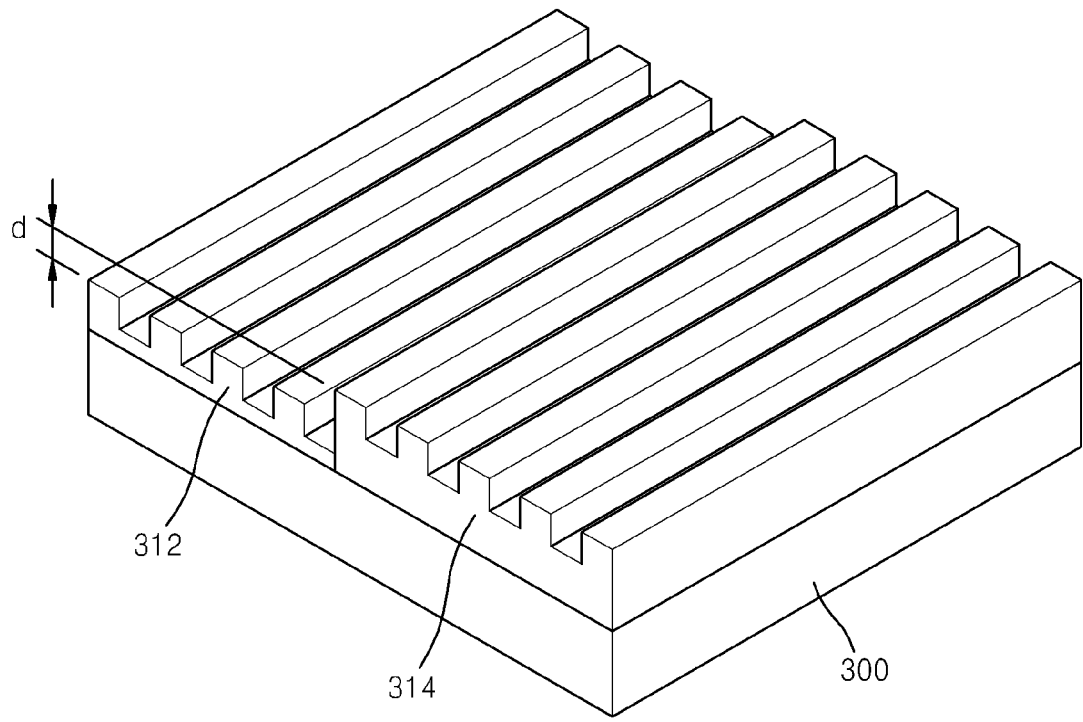
FIG. 4 is a perspective view showing a step difference between replica mold layers when the large area replica template is manufactured.

FIG. 4 is a perspective view showing a step difference between the replica mold layers 320 when the large area replica template is manufactured. In an embodiment, a first replica resin layer 312 and a second replica resin layer 314 that are provided on the template 300 may have substantially or precisely the same height as each other, but in an alternative embodiment, the first replica resin layer 312 and the second replica resin layer 314 may have a different height d, as shown in FIG. 4. In an embodiment, an empty space may exist between the first replica resin layer 312 and the second replica resin layer 314 by being spaced apart from each other when disposed on the template 300. In an embodiment, an edge unit of the first replica resin layer 312 may be located lower than the edge unit of the second replica resin layer 314 to prevent the occurrence of the empty space. In such an embodiment, there may be a step difference between the first replica resin layer 312 and the second replica resin layer 314, such that an undesired step difference or discontinuity may occur on the surface pattern of the replica mold layer 320 formed as shown in FIG. 3B. According to an embodiment, an additional process may be performed to prevent the occurrence of the step difference or discontinuity.

Figure 3D:
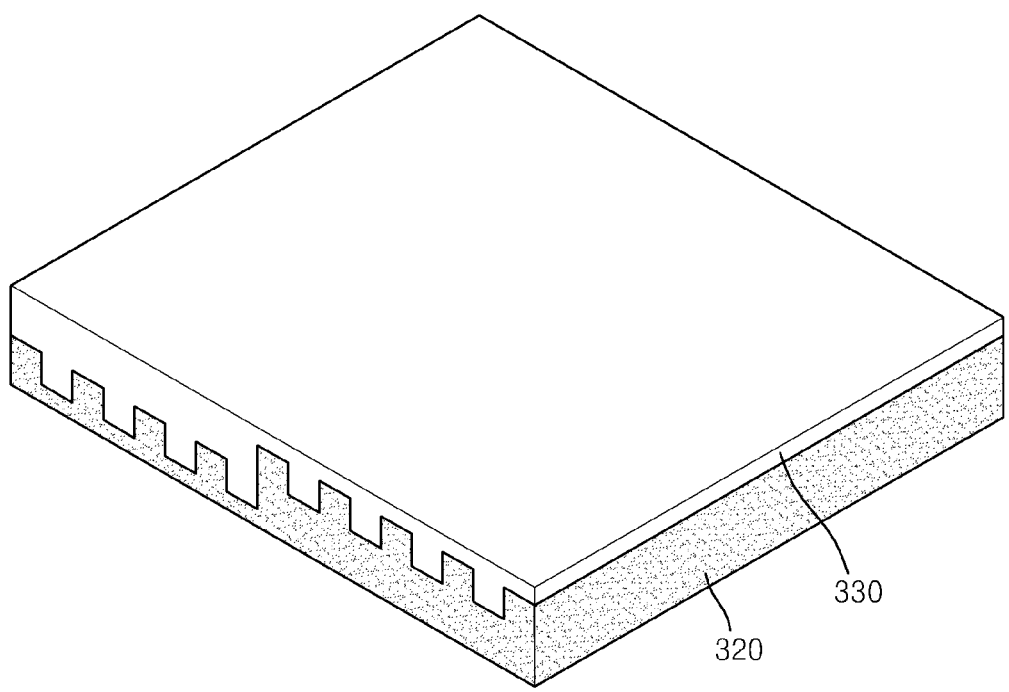

Referring to FIG. 3D, in an embodiment, a flexible stamp 330 may be formed on a surface of the replica mold layer 320. The flexible stamp 330 may be formed to have a pattern corresponding to a pattern formed on the surface of the replica mold layer 320 after coating a resin on the surface of the replica mold layer 320. In one embodiment, for example, the flexible stamp 330 may be formed to have a pattern corresponding to a fine pattern using a capillary force lithography process. In such an embodiment, a liquid phase resin is coated on the surface of the replica mold layer 320 to fill spaces between fine patterns that are formed on the surface of the replica mold layer 320, and afterwards, the flexible stamp 330 may be formed by solidifying the liquid phase resin through exposing with light, such as UV light. The resin that is used for forming the replica mold layer 320 may be a UV curable resin or a UV sensitive resin.

Figure 3E:
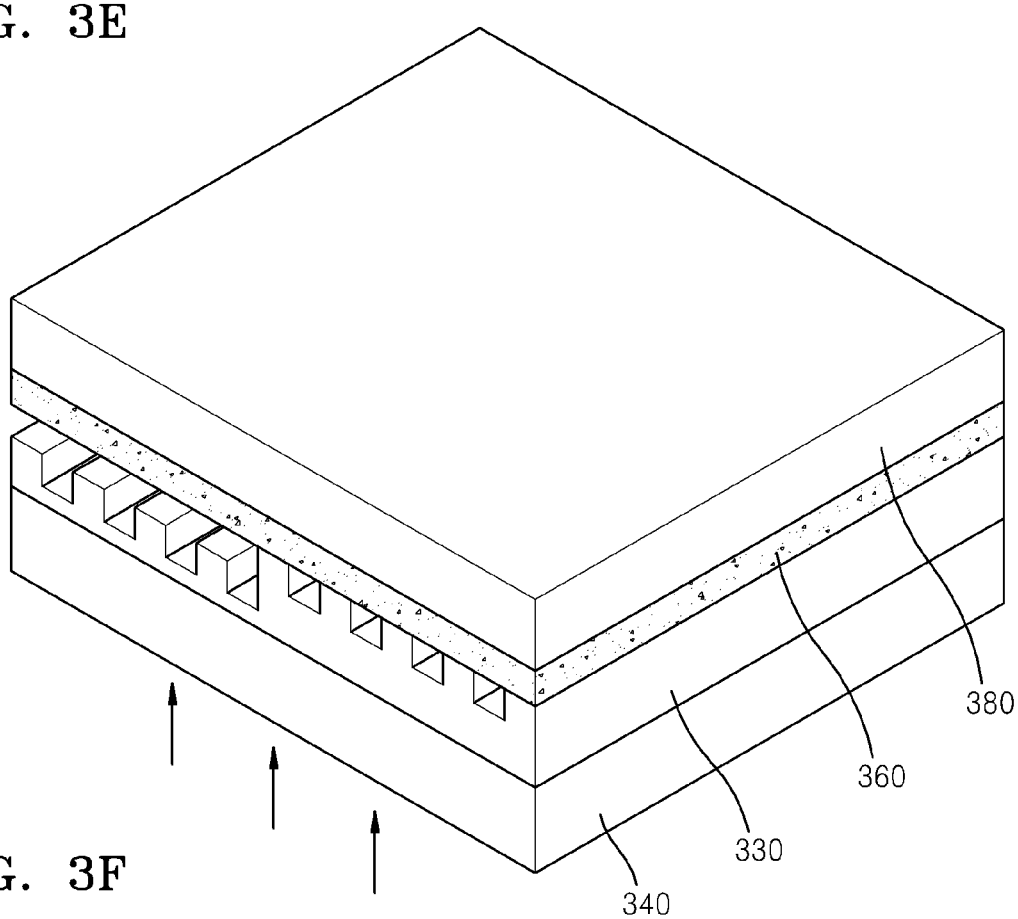

Referring to FIGS. 3D and 3E, the flexible stamp 330 is disposed on, e.g., transferred onto, a flexible plate 340. After coating a mold resin 360 on a surface of a substrate 380, a pattern formed on a surface of the flexible stamp 330 may be transferred to the mold resin 360 by compressing the flexible plate 340, on which the flexible stamp 330 is formed, onto the mold resin 360 in a direction toward the mold resin 360, e.g., in a direction indicated by the arrows. In an embodiment, as shown in FIG. 3E, the flexible plate 340 may be located below the substrate 380. However, in such an embodiment, the flexible stamp 330 may be disposed on or above the mold resin 360 in a state that the mold resin 360 provided, e.g., coated, on the substrate 380 is facing upward, and the flexible plate 340 may be compressed towards the substrate 380. When the flexible plate 340 is compressed, the patterns formed on the mold resin 360 may be formed to generally have a uniform height when a relatively higher pressure is applied to the patterns having a lower height than the patterns having a relatively higher height.

In such an embodiment, the mold resin 360 may be coated on the substrate 380 by various ways, such as a spin coating method, a dip coating method, an ink-jet method, or a slit-nozzle method. In one embodiment, for example, a pattern corresponding to the fine pattern of the surface of the flexible stamp 330 may be formed on the mold resin 360 using a capillary force lithography process. After coating a resin, a UV curing process or a drying process may further be performed. In such an embodiment, the resin may be a functionalized prepolymer that includes an acrylate group or epoxy, for example, but the resin is not specifically limited. In such an embodiment, the resin may further include a photoinitiator of a hardener to have reactivity with light, such as UV light. The substrate 380 may include or be formed of silicon, silicon oxide, silicon nitride, glass, or various semiconductor materials. The flexible plate 340 may include or be formed of a flexible and transformable material such that a height difference between the patterns of the surface of the flexible stamp 330 is decreased, and may have a modulus that is greater than about 100 kilograms (kg). In one embodiment, for example, the flexible plate 340 may include or be formed of a material, such as polydimethylsiloxane ("PDMS").

Figure 3F:
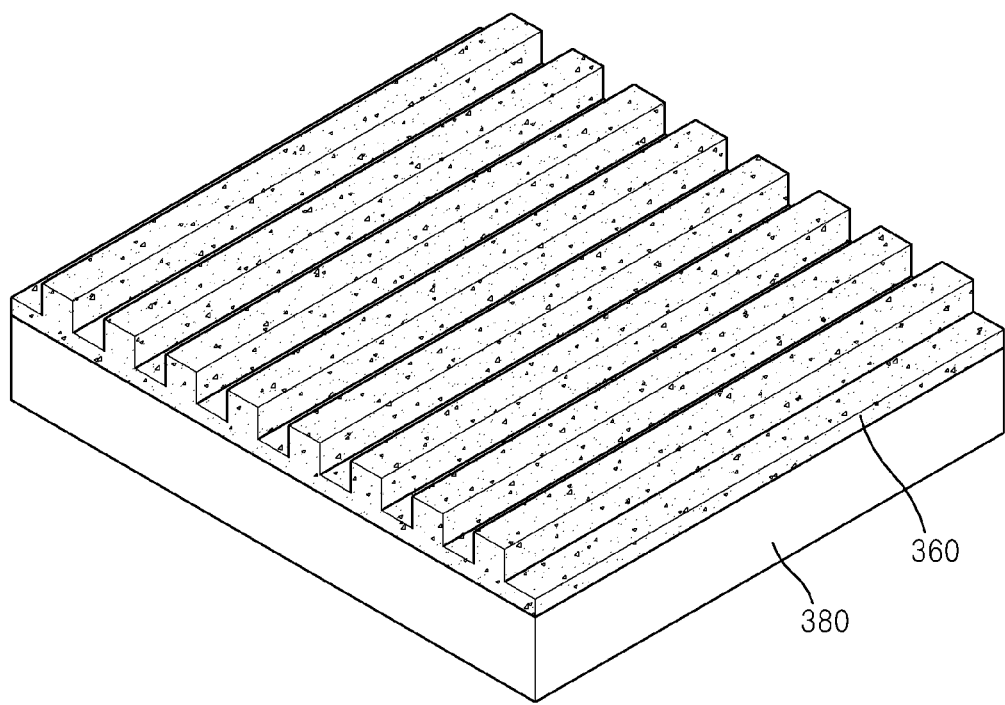

Referring to FIG. 3F, the mold resin 360 on the substrate 380 may be obtained. The pattern formed on the mold resin 360 may have a relatively uniform height compared to the pattern formed on the surface of the replica mold layer 320 shown in FIG. 3B.

Figure 3G:
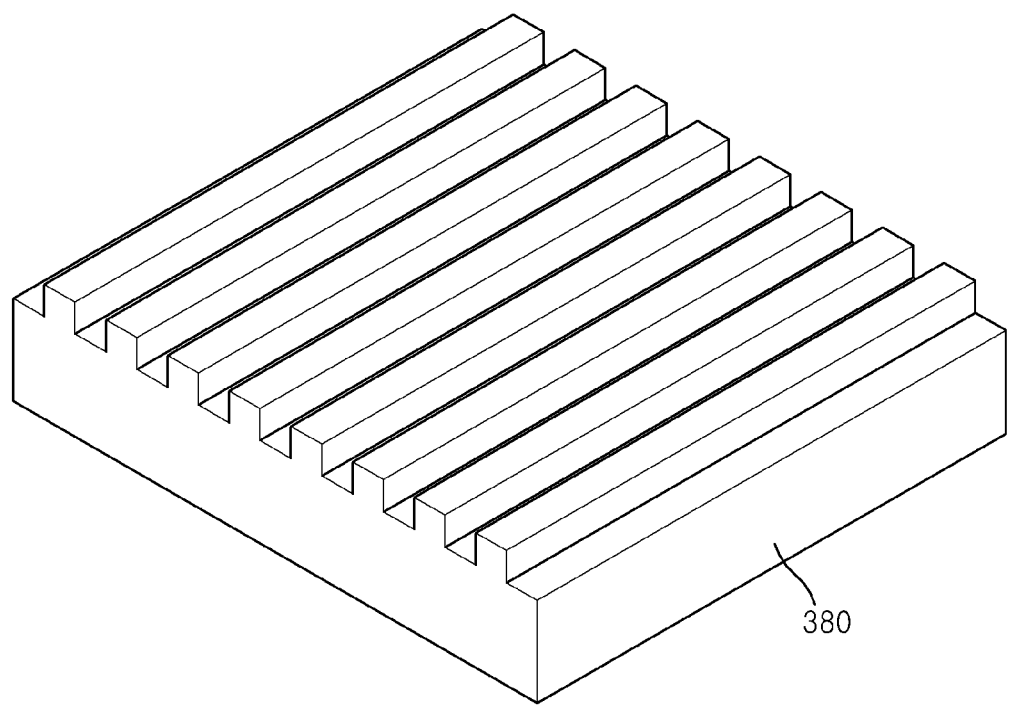

When the mold resin 360 is formed, a thickness of the mold resin 360 between protrusion regions of the patterns of the mold resin 360 may be formed to be very thin or the surface of the substrate 380 between the protrusion regions of the patterns of the mold resin 360 may be formed to be exposed by controlling the amount of the resin to be included in the mold resin 360. In such an embodiment, as shown in FIG. 3G, the substrate 380 having a pattern on a surface thereof, that is, a master mold, may be formed by performing an etch process on the substrate 380 using the mold resin 360 as a mask, and removing the mold resin 360 thereafter. In such an embodiment, the etching process may be determined based on the type of the substrate 380, and may include a dry etching process, a wet etching process, or a reactive ion etching process, for example.

FIGS. 5A through 5I are a perspective view and cross-sectional views illustrating another embodiment of a method of manufacturing a large area master mold using a large area replica template according to the invention.

Figure 5A:
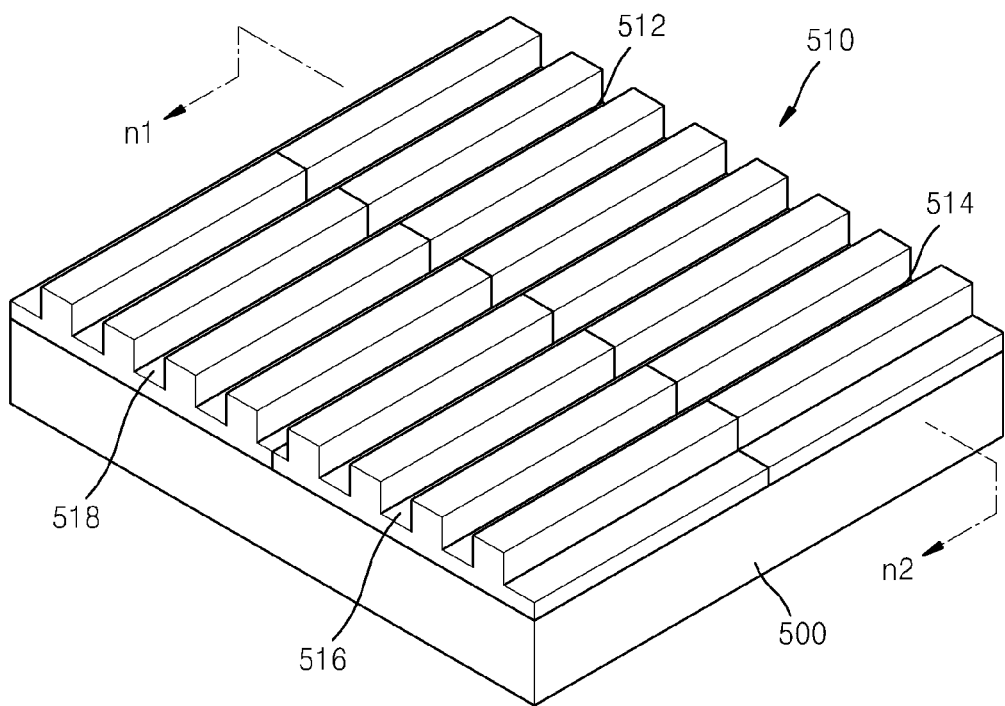
FIGS. 5A through 5I are perspective view and cross-sectional views illustrating another embodiment of a method of manufacturing a large area master mold using a large area replica template, according to the invention.

Referring to FIG. 5A, a resin layer 510 is provided, e.g., formed, on a template 500. The resin layer 510 may be formed by bonding a plurality of replica resin layers, e.g., first, second, third and fourth replica resin layers 512, 514, 516 and 518. The number and size of the replica resin layers included in the resin layer 510 may be variously determined based on use thereof, and are not limited to a specific number or size. The template 500 may have a size determined based on the number and size of the replica resin layers such that the replica resin layers, e.g., the first, second, third and fourth replica resin layers 512, 514, 516 and 518, may be stably disposed thereon, and the template 500 may include or be formed of silicon, silicon oxide, silicon nitride, glass, or various semiconductor materials, for example.

Figure 5B:
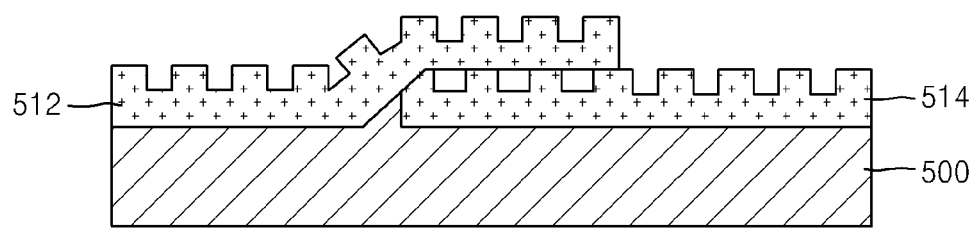

FIG. 5B is a cross-sectional view taken along line n1-n2 of FIG. 5A. Referring to FIG. 5B, in an embodiment, the resin layer 510 may be formed by bonding a plurality of replica resin layers, for example, first, second, third and fourth 512, 514, 516 and 518. In such an embodiment, a height difference or an empty space may exist on boundary regions of the first, second, third and fourth replica resin layers 512, 514, 516 and 518. In an embodiment, the first, second, third and fourth replica resin layers 512, 514, 516 and 518 are bonded by partly overlapping the first, second, third and fourth replica resin layers 512, 514, 516 and 518 to remove gaps and empty spaces between the first, second, third and fourth replica resin layers 512, 514, 516 and 518, such that a height difference or a non-uniformity (e.g., discontinuity) of the patterns of a surface of the resin layer 510 may occur. In one embodiment, for example, an edge of the first replica resin layer 512 may partly extend to be bonded on an edge of the second replica resin layer 514 by overlapping a portion of the edge of the first replica resin layers 512 and the edge of the second replica resin 514. In an embodiment, when a master mold is formed by transferring a pattern of the surface of the replica template 500, a process for effectively preventing or minimizing the occurrence of a step difference between the patterns of a region may be performed.

Figure 5C:
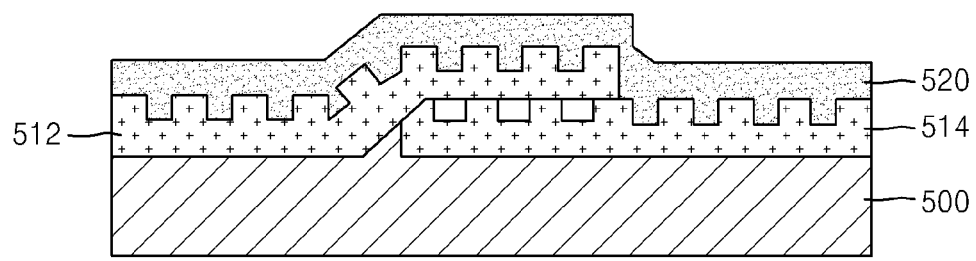

Referring to FIG. 5C, a first photoresist layer 520 may be formed on the first and second replica resin layers 512 and 514. The first photoresist layer 520 may be formed to have a uniform thickness. The first photoresist layer 520 may have a pattern corresponding to the pattern of surfaces of the first and second replica resin layers 512 and 514, and may have a shape corresponding to the height difference or a shape of a discontinued region of the pattern of the surfaces of the first and second replica resin layers 512 and 514.

Figure 5D:
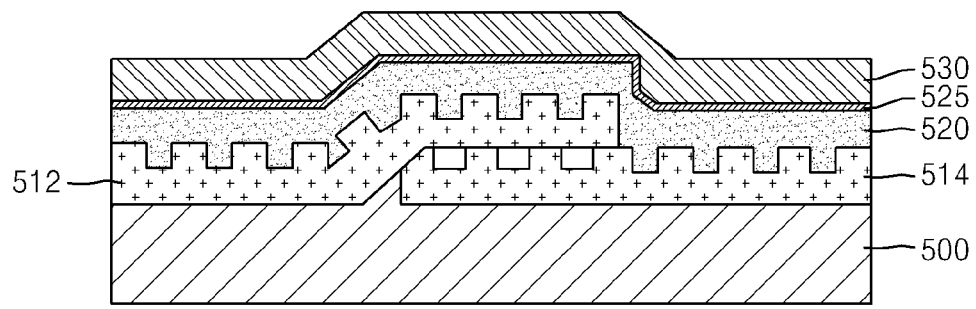

Referring to FIG. 5D, an adhesive layer 525 and a flexible plate 530 may be formed on the first photoresist layer 520. The flexible plate 530 may have a shape corresponding to a surface shape of the first photoresist layer 520, and may include or be formed of a flexible and transformable material. The flexible plate 530 may include or be formed of a material, such as PDMS. The adhesive layer 525 is formed for bonding the first photoresist layer 520 and the flexible plate 530, may have a thickness relatively smaller than those of the first photoresist layer 520 and the flexible plate 530, and may be optionally formed.

Figure 5E:
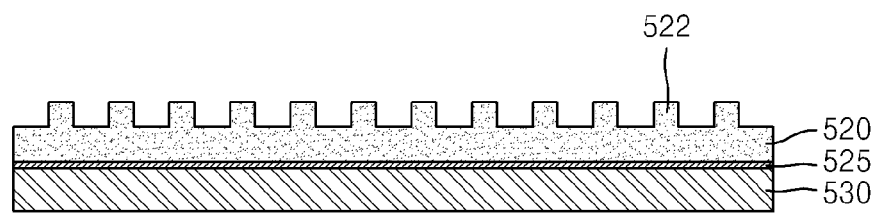

Referring to FIG. 5E, the first photoresist layer 520 is separated from the first and second replica resin layers 512 and 514. In such an embodiment, where the first photoresist layer 520 is bonded to the flexible plate 530, the first photoresist layer 520 and the first and second replica resin layers 512 and 514 may be physically separated from the first photoresist layer 520 by disposing the flexible plate away from the first and second replica resin layers 512 and 514. The first photoresist layer 520 that is separate from the first and second replica resin layers 512 and 514 may have a pattern 52 having a relatively uniform shape by widely spreading or expanding the flexible plate 530.

Figure 5F:
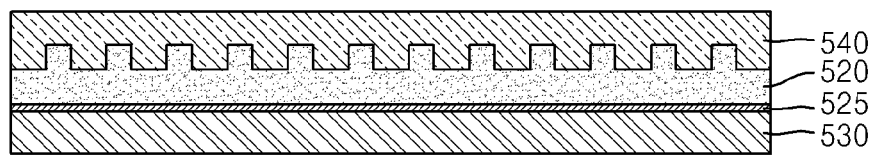

Referring to FIG. 5F, a second photoresist layer 540 may be formed on the first photoresist layer 520. The second photoresist layer 540 may be formed to have a pattern corresponding to the pattern of the first photoresist layer 520. Each of the first and second photoresist layers 520 and 530 may include various materials, for example, polyvinyl alcohol, polyvinyl alkyl ether, styrene, acrylic acid, meta-acrylic acid, polyvinyl hydroxybenzoate, polyvinyl hydroxybenzene or a combination thereof, and may further include a photosensitizer. In such an embodiment, the second photoresist layer 540 may be a layer formed of a different material used to form the first photoresist layer 520 and may include or be formed of a photoresist material having different photosensitizing characteristics or different dissolution characteristics from the photoresist material of the first photoresist layer 520.

Figure 5G:
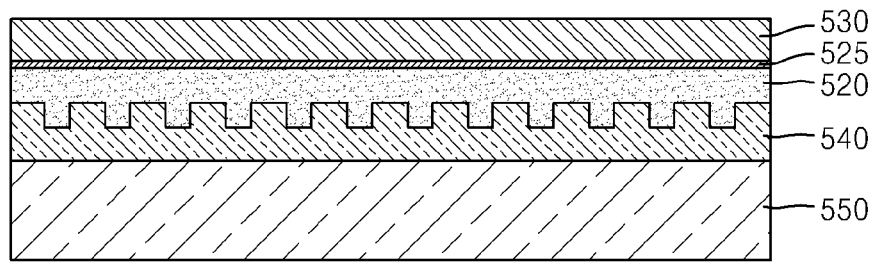

Referring to FIG. 5G, the second photoresist layer 540 is disposed on a substrate 550. In such an embodiment, an adhesive layer may be optionally formed between the second photoresist layer 540 and the substrate 550 to bond the second photoresist layer 540 to the substrate 550. The adhesive layer, the first photoresist layer 520, or the second photoresist layer 540 may be formed using a spin coating method, a dip coating method, an ink-jet method, or a slit-nozzle method, for example. The substrate 550 may include or be formed of silicon, silicon oxide, silicon nitride, glass, or various semiconductor materials, for example.

Figure 5H:
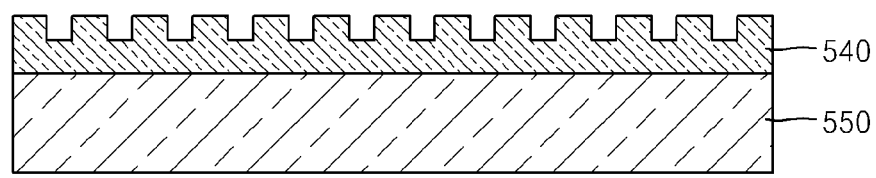
Figure 5I:
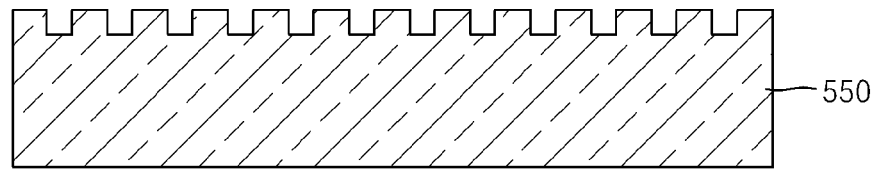

Referring to FIG. 5H, the first photoresist layer 520 on the second photoresist layer 540 is removed. The flexible plate 530 may be physically removed, and the first photoresist layer 520 may be removed using an exposing and developing process according to the characteristic of the material used to form the first photoresist layer 520 after the flexible plate 530 is removed. Accordingly, the second photoresist layer 540 having a pattern may be obtained on the substrate 550, and then a pattern corresponding to the pattern formed on the second photoresist layer 540 may be formed on a surface of the substrate 550 by an etching process, thereby forming the substrate 550 having a pattern, that is, a master mold, as shown in FIG. 5I. In such an embodiment, the etching process or method is not limited to a specific etching method, and may be variously determined based on the type of material used to form the substrate 550. In such an embodiment, the etching process or method may include a dry etching method, a wet etching method, or a reactive ion etching method, for example.

In general, a master mold having a diameter of, for example, a few several inches may be efficiently manufactured for a nano-imprint method. However, a master mold having a diameter that is greater than approximately 12 inches may not be efficiently or effectively manufactured. In an embodiment of the invention, after manufacturing a large area replica template, a large area master mold may be manufactured using the large area replica template. In such an embodiment, the large area master mold may be used for manufacturing a nano line-width fine circuit for semiconductor, a highly integrated hard disk, or a cross-bar type volatile or non-volatile molecule memory, for example. In such an embodiment, the large area master mold may be used for a manufacturing process of a large area wire grid polarizer or various kinds of displays or bio sensors, for example.

According to embodiments described herein, a large area master mold, a size of which is controllable based on use, may be provided. In such embodiments, a plurality of replica resin layers formed from a single mold or a plurality of molds are bonded on a surface of a large area template, and although there may be a height difference between the replica resin layers or a discontinuity pattern region on the large area template, a master mold having a relatively uniform pattern shape may be manufactured by compensating for the height difference or the discontinuity pattern region.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing a master mold, the method comprising:
   forming a plurality of replica resin layers using a mold;
   forming a replica template by bonding the plurality of replica resin layers on a template;
   separating the mold from the plurality of replica resin layer,
   forming a replica mold layer having a pattern corresponding to a pattern of the plurality of replica resin layers using the replica template;
   forming a flexible stamp having a pattern formed on a surface thereof using the replica mold layer;
   transferring the pattern formed on the surface of the flexible stamp to a mold resin; and
   forming the master mold having a large area by etching a surface of a substrate based on a pattern shape of the mold resin,
   wherein the mold is separated from the plurality of replica resin layer by bonding a surface of the plurality of replica resin layer, on which the pattern of the plurality of replica resin layers is not formed, to an adhesive layer on the template.

2. The method claim 1, wherein the forming the replica template comprises bonding the plurality of replica resin layers on the template after the forming the plurality of replica resin layers using the mold.

3. The method claim 1, wherein the forming the plurality of replica resin layers comprises using a plurality of molds.

4. The method claim 1, wherein
   the plurality of replica resin layers are aligned with each other and bonded on the template, and
   at least a portion of each of the plurality of replica resin layers overlaps another replica resin layer.

5. The method claim 1, wherein the forming the flexible stamp comprises using a capillary force lithography.

6. The method claim 1, wherein the transferring the pattern formed on the surface of the flexible stamp to the mold resin comprises:
   disposing the flexible stamp on a flexible plate; and applying a pressure on the flexible plate toward the mold resin provided on the substrate.

7. A method of manufacturing a master mold, the method comprising:
  forming a plurality of replica resin layers using a mold;
  forming a replica template by bonding the plurality of replica resin layers on a template;
  separating the mold from the plurality of replica resin layer,
  forming a first photoresist layer having a pattern corresponding to a pattern of the plurality of replica resin layers;
  forming a second photoresist layer having a pattern corresponding to the pattern of the first photoresist layer on the first photoresist layer;
  disposing the second photoresist layer on a substrate;
  separating the second photoresist layer from the first photoresist layer; and
  forming the master mold having a large area by etching a surface of the substrate based on the pattern shape of the second photoresist layer,
  wherein the mold is separated from the plurality of replica resin layer by bonding a surface of the plurality of replica resin layer, on which the pattern of the plurality of replica resin layers is not formed, to an adhesive layer on the template.

8. The method of claim 7, wherein the forming the replica template comprises bonding the plurality of replica resin layers on the template after the forming the plurality of replica resin layers using the mold.

9. The method of claim 7, wherein the forming the plurality of replica resin layers comprises using a plurality of molds.

10. The method of claim 7, wherein
  the plurality of replica resin layers are aligned with each other and bonded on the template, and
  at least a portion of each of the plurality of replica resin layers overlaps another replica resin layer.

11. The method claim 7, further comprising:
  bonding a flexible plate on the first photoresist layer; and
  separating the first photoresist layer from the replica template after the first photoresist layer is formed on the replica template.

12. The method claim 11, further comprising:
  providing an adhesive layer between the first photoresist layer and the flexible plate.

13. The method of claim 7, wherein the first photoresist layer and the second photoresist layer are formed of different materials from each other.

* * * * *